(12) United States Patent
Gracias et al.

(10) Patent No.: US 6,905,958 B2
(45) Date of Patent: Jun. 14, 2005

(54) PROTECTING METAL CONDUCTORS WITH SACRIFICIAL ORGANIC MONOLAYERS

(75) Inventors: David H. Gracias, Portland, OR (US); Grant Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/628,297

(22) Filed: Jul. 25, 2003

(65) Prior Publication Data

US 2005/0020058 A1 Jan. 27, 2005

(51) Int. Cl.[7] .................. H01L 21/4763; H01L 21/469
(52) U.S. Cl. .................. 438/643; 438/780; 438/781
(58) Field of Search .................. 438/618, 637, 438/643, 680, 778, 780, 781

(56) References Cited

U.S. PATENT DOCUMENTS

| 5,236,602 | A | * | 8/1993 | Jackson ............... 210/748 |
| 6,297,169 | B1 | * | 10/2001 | Mangat et al. ......... 438/736 |
| 6,323,131 | B1 | * | 11/2001 | Obeng et al. .......... 438/687 |
| 6,482,733 | B2 | * | 11/2002 | Raaijmakers et al. ... 438/633 |
| 6,482,740 | B2 | * | 11/2002 | Soininen et al. ....... 438/686 |
| 6,518,168 | B1 | * | 2/2003 | Clem et al. ........... 438/623 |

OTHER PUBLICATIONS

Laibinis, Paul E., et al., "Comparison of the Structures and Wetting Properties of Self–Assembled Monolayers of n–Alkanethiols on the Coinage Metal Surfaces, Cu, Ag, Au," Journal of the American Chemical Society, vol. 113, No. 19; Sep. 11, 1991, pp. 7152–7167.

Laibinis, Paul E., et al., "Self–Assembled Monolayers of n–Alkanethiolates on Copper are Barrier Films That Protect the Metal Against Oxidation by Air," Journal of the American Chemical Society, vol. 114, 1992, pp. 9022–9028.

* cited by examiner

Primary Examiner—Michael Trinh
Assistant Examiner—Pamela E Perkins
(74) Attorney, Agent, or Firm—Blakely, Sokoloff, Taylor & Zafman LLP

(57) ABSTRACT

A structure and method for protecting exposed copper lines with chemisorbed, sacrificial, organic monolayers from further processing steps are herein described.

26 Claims, 6 Drawing Sheets

PROTECTING METAL CONDUCTORS WITH SACRIFICIAL ORGANIC MONOLAYERS

FIELD

This invention relates to the field of fabricating interconnect structures, and in particular, to protecting metal conductors during sealing or treating of dielectric materials in a damascene process.

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between the metal lines.

To obtain the desired low dielectric constant, porosity is often introduced into the dielectric material. When vias and trenches are etched in the porous dielectric material, pores are often exposed on the surfaces of the dielectric. These exposed pores typically increase problems that exist when further processing is done on dielectric materials. For example copper formed in the trenches and vias, without a barrier, may diffuse into the dielectric material causing the shorting of adjacent copper lines or line-to-line leakage.

Prior art interconnect structures employ a barrier layer over the surface of the dielectric to protect from copper diffusing into the dielectric material. Yet, any discontinuity in the barrier film will result in the diffusion of copper atoms or penetration of plating solution into the dielectric, which may cause copper lines to short, leakage from line-to-line to occur, and/or destruction of the dielectric material. A thicker barrier layer, which may cover any discontinuities, takes up additional volume in a via or a trench increasing the resistance by reducing the volume available for copper and adding a series resistance to an underlying copper connection.

Therefore, as seen in FIG. 1, related art requires sealing dielectric 120 before a metal conductive layer such as a barrier layer or a copper layer may be formed. As seen in FIG. 1, when sealant layer 125 is formed, conductor 110 has a portion that is exposed to the sealant treatment. Typically, when a portion of conductor 110 is exposed to a sealant treatment, undesirable increases in line resistances, formation of mobile copper ions that increase leakage currents, and electromigration failures may occur.

Related art attempts to protect the copper from sealing by either using mild pore sealing treatments that do not attack the portion of exposed copper or attempting to seal the pores when the copper is not exposed. However, mild pore sealing treatments have been shown to be ineffective, and sealing the pores when copper is not exposed would require etch processing after the treatment, which could degrade the seals.

BRIEF DESCRIPTION OF THE DRAWINGS

The present invention is illustrated by way of example and not intended to be limited by the figures of the accompanying drawings.

FIG. 4b illustrates an enlarged portion of FIG. 4a.

FIG. 5b illustrates an enlarged portion of FIG. 5a.

FIG. 6b illustrates an enlarged portion of FIG. 6a.

DETAILED DESCRIPTION

In the following description, numerous specific details are set forth such as examples of specific long chain molecules, sealing methods, and oxidants in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Figure 1:
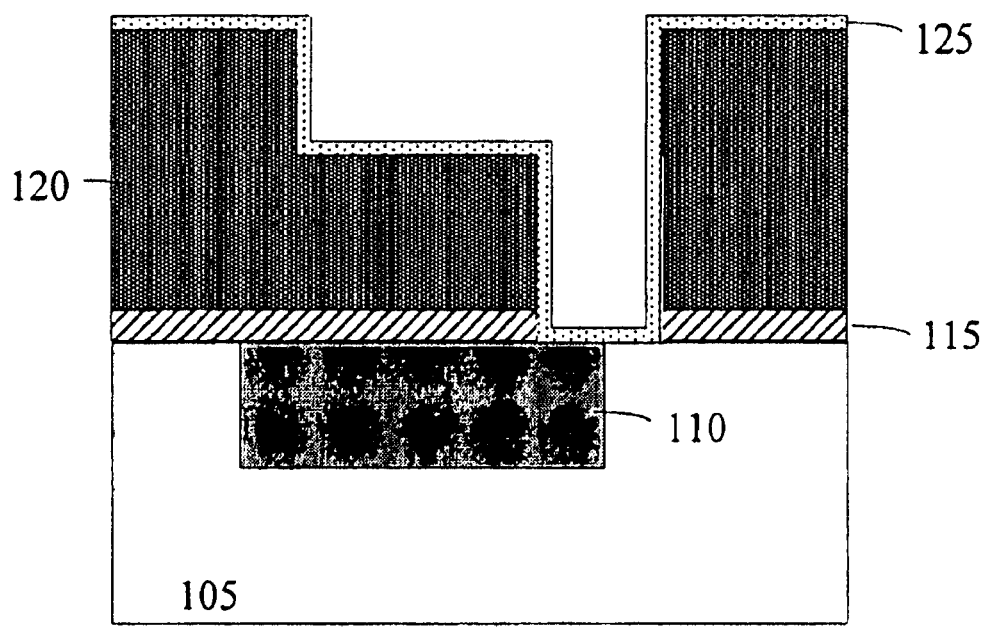
FIG. 1 is a prior art cross-sectional elevation view of a trench and via defined by an interlayer dielectric that is disposed on an underlying layer containing a metal conductor, after the interlayer dielectric has been sealed with a sealant layer.
Figure 2:
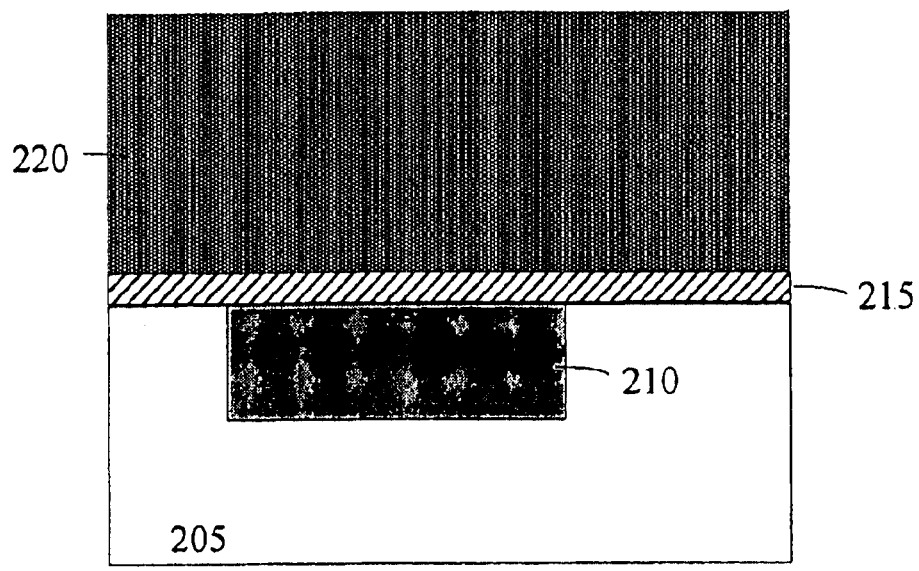
FIG. 2 is a cross-sectional elevation view of a dielectric material disposed on an underlying layer that contains a metal conductor.

Referring first to FIG. 2, an underlying layer 205 is illustrated, which often is comprised of several active devices and/or a layer with conductors exposed. Underlying layer 205 may be a semiconductor wafer including device regions, other structures such as gates, local interconnects, metal layers, or other active/passive device structures or layers. In FIG. 2, underlying layer 205 has underlying conductor 210. Underlying conductor 210 may be copper or copper alloy, as well as some other conductive material such as gold.

FIG. 2 further illustrates an interlayer dielectric (ILD) 220, which is disposed on underlying layer 205. As an illustrative example, FIG. 2 depicts ILD 220 disposed on etch stop 215. Etch stop 215 may be comprised of silicon nitride (Si3N4), silicon carbide (SiC), or other etch resistant material. It is readily apparent that etch stop 215 may not be used, as well as replace by other structures, such as cladding.

ILD 220 may be formed from any one of a plurality of known dielectric materials. ILD 220 may be a porous, nano-porous, or non-porous dielectric material. As an illustrative example ILD 220 may be an oxide/spin-on glass. Some examples of oxide dielectrics include: LKD-5109, which may be obtained from JSR; Nanoglass-E, which may be obtained from Honeywell; and Zirkon, which may be obtained from Shipley. As another illustrative example, ILD 220 may be a polymer. Some examples of polymer dielectrics are porous silk, which may be obtained from Dow Chemical and GX-3P, which may be obtained from Honeywell.

Figure 3:
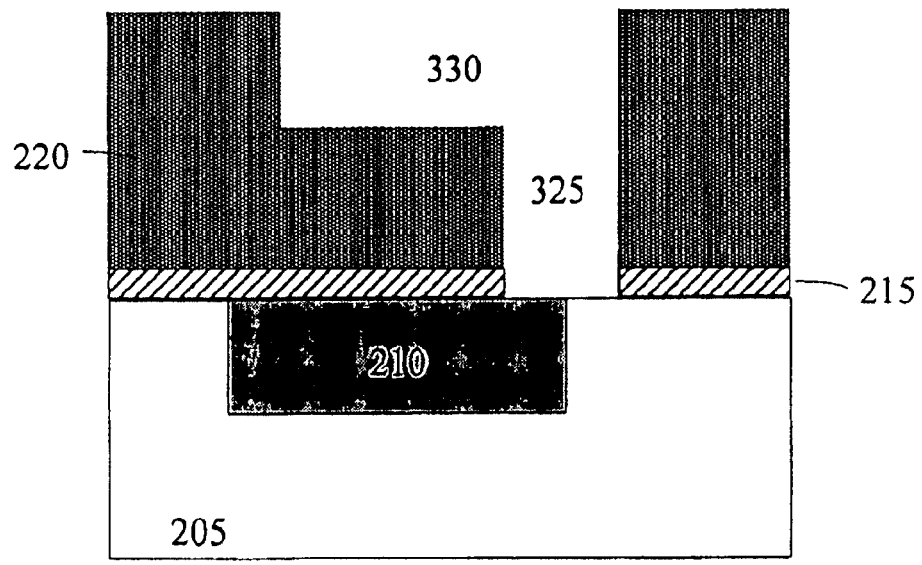
FIG. 3 illustrates the structure of FIG. 2 after a via and a trench have been etched into the dielectric, exposing a portion of the metal conductor in the underlying layer.

Turning to FIG. 3, via 325 and trench 320 are etched into ILD 220 and through etch stop 215, exposing a portion of underlying conductor 210. Ordinary masking and etching processes are used to form trench 320, via 325, and any other trenches or vias needed within ILD 220.

Figure 4A:
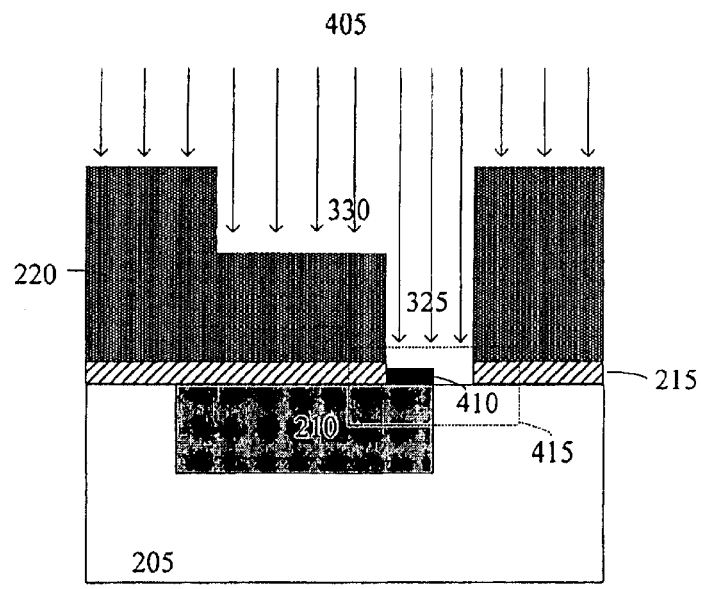
FIG. 4a illustrates the structure of FIG. 3 after a processing step to form an organic monolayer on the portion of exposed metal conductor.
Figure 4B:
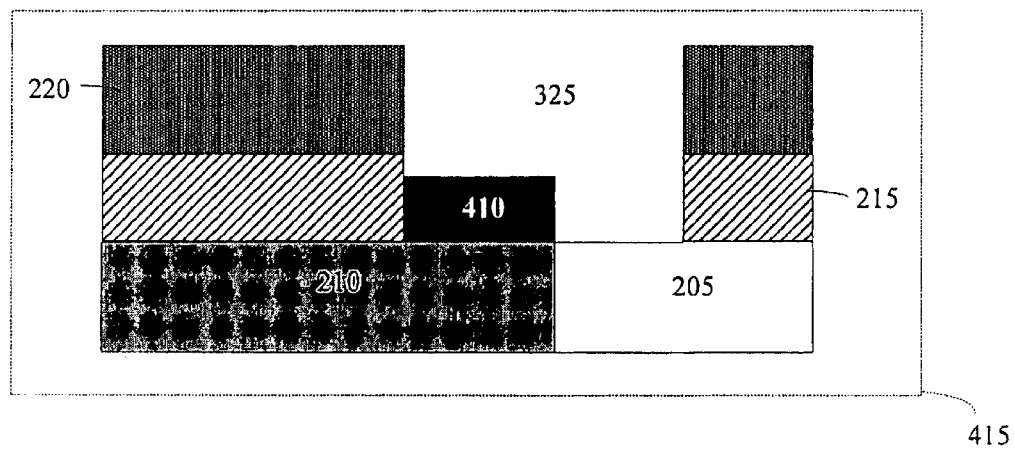

Next, as illustrated in FIGS. 4a and 4b, an organic monolayer 410 is formed on the exposed portion of underlying conductor 210. FIG. 4b depicts enlarged portion 415 of FIG. 4a to better illustrate organic monolayer 410. Organic monolayer 410 may be used as a protective organic layer for underlying conductor 210 against further processing steps. Examples of further processing steps are discussed in more detail in reference to FIGS. 6a and 6b. Organic monolayer 410 may be formed with several materials.

For example, organic monolayer 410 may be formed with functionalized long chain organic molecules. A discussion of how functionalized long chain organic molecules adsorb strongly to metal substrates and act as protective coatings may be found in, "Comparison of the structures and wetting properties of self-assembled monolayers of n-alkanethiols on the coinage metal surfaces, Cu, Ag, Au," by Laibinis-P E; Whitesides-G M; Allara-D L; Yu-Tai-Tao; Parikh-A N; Nuzzo-R G, Journal-of-the-American-Chemical-Society, vol. 113, no. 19, September 1991, pages 7152–67 and "Self-Assembled Monolayers of n-alkanethiolates on copper are barrier films that protect the metal against oxidation by air," by Paul E. Laibinis and G. M. Whitesides, Journal-of-the-American-Chemical-Society, vol. 113, 1992, beginning at page 9022.

As illustrative examples, self-assembled monolayers (SAMs) that may be used for organic monolayer 410 include: thiols; phosphines; amines; alcohols; carbonyls; carboxylic acids; or any other molecule/group that readily forms on late transition metals such as copper and gold. Yet, it is well known that the aforementioned organic materials do not readily form on ILD 220; therefore, allowing further treatment of ILD 220, while protecting underlying conductor 210.

In one embodiment, molecules such as dodecanethiol, dodecanoic acid, 1-aminododecane, dodecanol, dodecany phosphine, or 2-dodecanone could be used to form organic monolayer 410. In another embodiment, bi-functional molecules such as 12-amino-1-dodecanol could be used to form organic monolayer 410. A bi-functional molecule may be utilized to improve absorption to the specific metal, such as copper, used for underlying conductor 210 on one side of the molecule and to provide inertness to the specific further processing steps, such as sealing the dielectric, on the other side of the molecule.

Organic monolayer 410 may be formed on metal conductor 210 by chemisorption of the organic material to the exposed portion of underlying conductor 210 in processing step 405. Chemisorption may be accomplished by exposing the surfaces of ILD 220 and the exposed portion of underlying conductor 210 to the organic material used for organic monolayer 410. In one embodiment, the surfaces of ILD 220 and underlying conductor 210 may be exposed to the organic material used for organic monolayer 410 by the well-known method of dip-coating. In another embodiment, spin-coating may be used. In yet, another embodiment the organic material may be sprayed-on. It is readily apparent, that any deposition method may be used that would expose ILD 220 and underlying conductor 210 to the organic material that adsorbs to underlying conductor 210.

Furthermore, many of the molecules and groups aforementioned will not form strong SAMs on ILD materials such as silicates or polymers and may be readily rinsed away. Therefore, an organic monolayer may be formed on the whole surfaces of ILD 220 and rinsed to selectively leave only organic monolayer 410 on the portion of exposed underlying conductor 410.

Figure 5A:
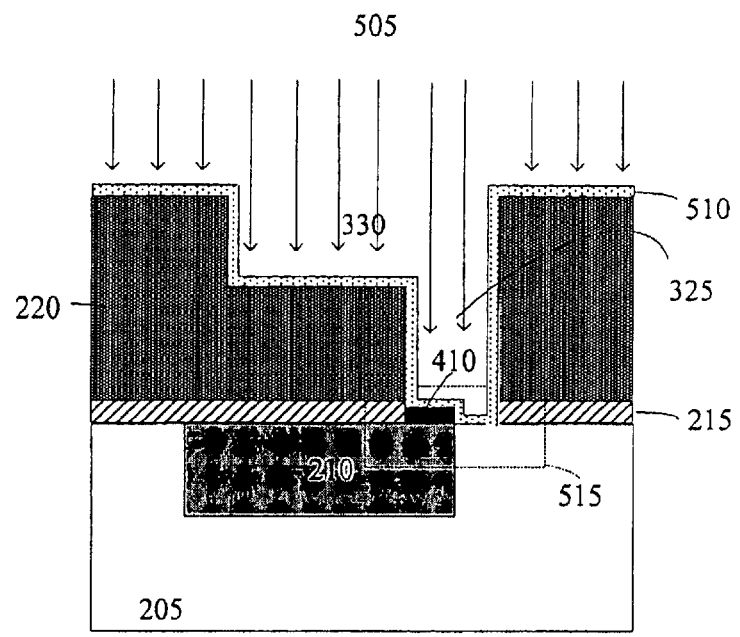
FIG. 5a illustrates the structure of FIG. 4a after sealing the dielectric material.
Figure 5B:
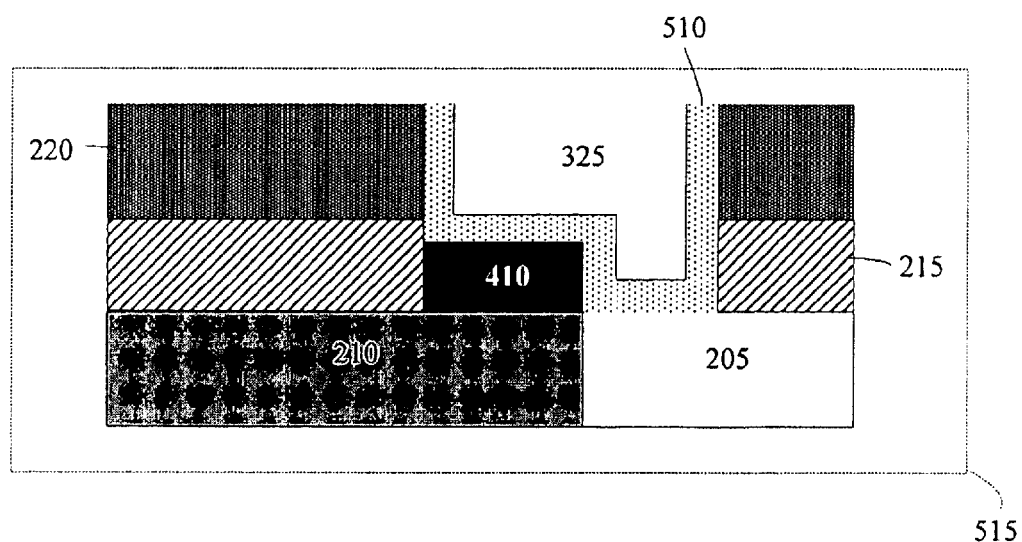

After exposing/chemisorption, other processing steps may be completed, while protecting underlying copper layer 410, as seen in FIGS. 5a–5b. FIG. 5b depicts enlarged portion 515 of FIG. 5a. For example, the surfaces of ILD 220 may be sealed with layer 510 in processing step 505, so as to line via 325 and trench 320. In one embodiment, layer 510 may be a thin dense film that lines ILD 220 and organic monolayer 410. The thin dense film may comprise SiN, SiO2, SiC, or other thin film used to seal porous dielectrics. In another embodiment, layer 510 may represent the increased density of the surfaces of ILD 220 after plasma treatment. Plasma gas, such as nitrogen, argon, or helium may be used to seal the surfaces of ILD 220, by increasing the density of the surfaces of ILD 220. Organic monolayer 410 may be designed to protect from the plasma etch. In yet another embodiment, ILD 220 may be sealed by using a silane coupling reagent to fill any pores exposed on the surfaces of ILD 220 as described in pending application Ser. No. 10/627,838.

Figure 6A:
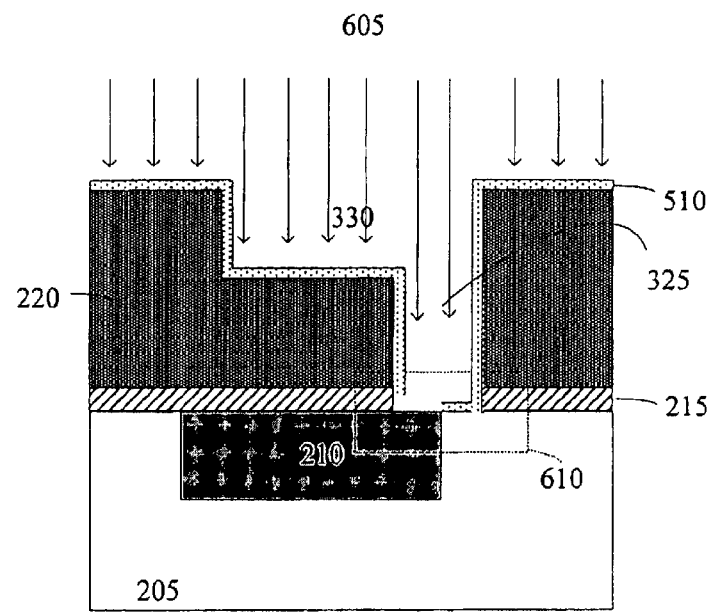
FIG. 6a illustrates the structure of FIG. 5a after the organic monolayer has been removed.
Figure 6B:
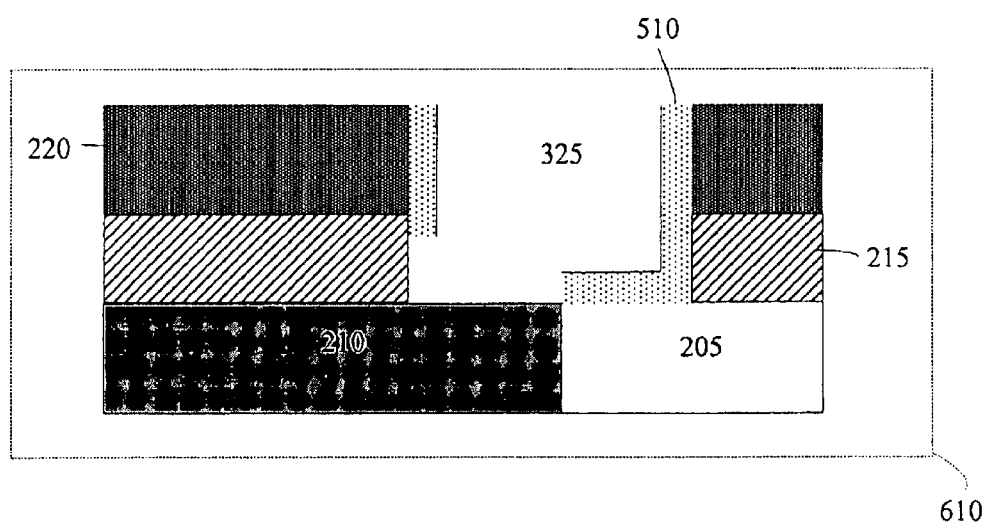

Turning to FIGS. 6a and 6b, organic monolayer 410 may be removed/desorbed, re-exposing the portion of underlying conductor 210 that was protected by organic monolayer 410, such as in processing step 605. FIG. 6b depicts enlarged portion 610 of FIG. 6a. Organic monolayer 410 may be removed by thermal processing. Thermal processing may include heating the structure to a temperature, wherein organic monolayer is removed/desorbed, leaving the rest of the structure. Organic monolayer 410 may also be removed by several other treatments, such as oxidation. To remove organic monolayer 410 and not remove underlying metal conductor 210, an oxidant that does not aggressively oxidize the material in underlying conductor 210 should be used; therefore, an oxidant should be used that has a more positive reduction potential than organic monolayer 410, but has a more negative reduction potential than the material in underlying conductor 210. As an illustrative example, formaldehyde may be used as an oxidant to remove/desorb organic layer 410.

Figure 7:
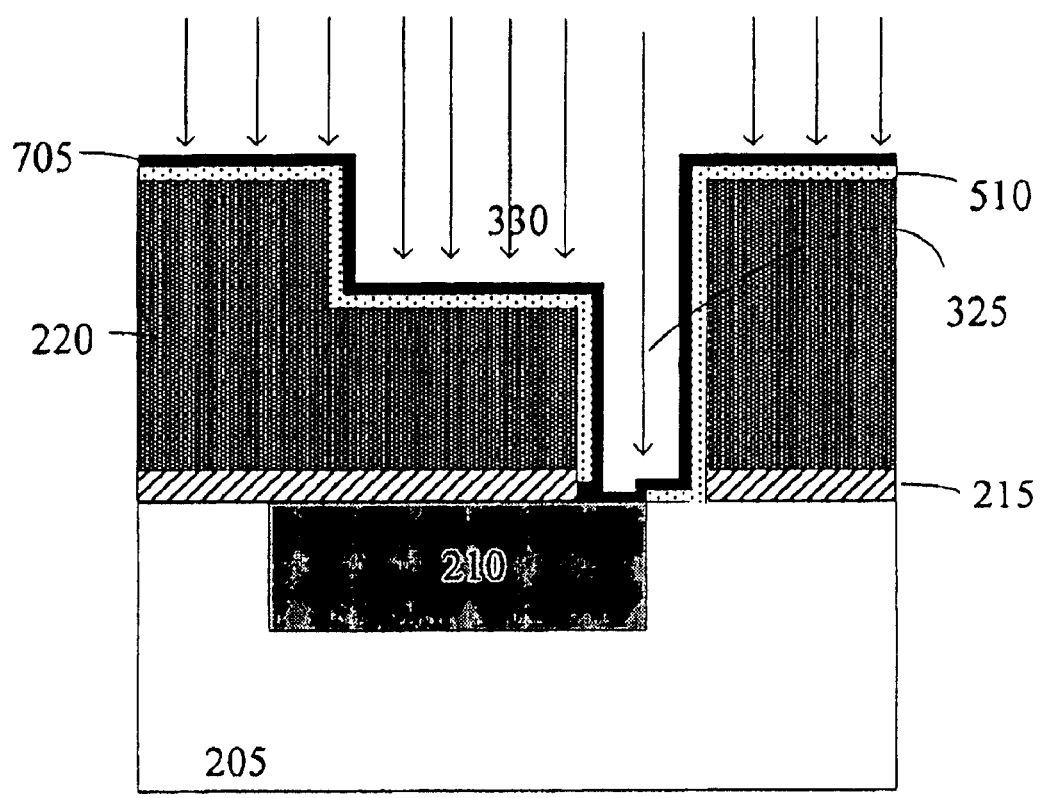
FIG. 7 illustrates the structure of FIG. 6a after a barrier layers has been deposited.

Referring to FIG. 7, a barrier layer 705 is formed on the surfaces of ILD 220 over layer 510. In one embodiment, barrier layer 705 is comprised of tantalum (Ta). In another embodiment, barrier layer 705 is comprised of tantalum nitride (TaN). Other materials, such as Ta/TaN bilayers, TiN, WCN, TiSiN, may be used for barrier layer 705. Tantalum may be deposited using known methods of deposition, such as physical vapor deposition (PVD). Other methods of deposition may include ALD (atomic layer deposition) and MOCVD (metalorganic chemical vapor deposition).

As seen from the description above, protection of an exposed portion of an underlying metal conductor is paramount during processing to prevent such issues as undesirable leakage currents and electromigration failures. Therefore, by using a sacrificial organic monolayer to absorb/form on the exposed portion of the underlying metal conductor, the metal conductor can be protected from further processing steps, such as sealing of a porous dielectric, which would increase resistance or harm the metal conductor. Moreover, the sacrificial organic monolayer may be removed after further processing, to reconnection expose the copper for connection to another layer.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:

disposing an interlayer dielectric on an underlying layer, the underlying layer having an underlying conductor;

etching a via and a trench in the interlayer dielectric exposing at least a portion of the underlying conductor;

forming an organic monolayer on the exposed portion of the underlying conductor;

lining the surfaces of the interlayer dielectric, so as to line the via and the trench; and removing the organic monolayer, re-exposing the portion of the underlying conductor.

2. The method of claim 1, wherein lining the surfaces of the interlayer dielectric comprises: lining the interlayer dielectric with a thin dense film.

3. The method of claim 2, wherein the thin dense film is selected from the group consisting of SiN, $SiO_2$, and SiC.

4. The method of claim 1, wherein lining the surfaces of the interlayer dielectric comprises: forming a barrier layer over the surfaces of the interlayer dielectric.

5. The method of claim 4, wherein the barrier layer comprises tantalum.

6. The method of claim 1, wherein lining the interlayer dielectric comprises: exposing the surfaces of the interlayer dielectric to plasma, so as to seal the interlayer dielectric.

7. The method of claim 1 wherein the organic monolayer comprises a functionalized long chain organic molecule.

8. The method of claim 7, wherein the functionalized long chain organic molecule is selected from the group consisting of thiols, phosphines, amines, alcohols, carbonyls, and carboxylic acids.

9. The method of claim 1, wherein the organic monolayer is removed by thermal processing.

10. The method of claim 1, wherein the organic monolayer is removed by oxidation.

11. The method of claim 10, wherein formaldehyde is used to oxidize the organic monolayer.

12. The method of claim 1, wherein dip-coating is used to form the organic monolayer.

13. The method of claim 1, wherein spin-coating is used to form the organic monolayer.

14. The method of claim 1, wherein the organic monolayer is sprayed on.

15. The method of claim 1, wherein the metal conductor comprises copper.

16. The method of claim 1, wherein the interlayer dielectric comprises dielectric material and pores.

17. The method of claim 16, wherein the dielectric material comprises an oxide.

18. The method of claim 16, wherein the dielectric material comprises a polymer.

19. A method comprising:

chemisorbing a protective organic layer selectively onto a portion of conductive material, wherein the conductive material is in a porous dielectric;

sealing the surfaces of the porous dielectric; and desorbing the protective organic layer to re-expose the portion of conductive material.

20. The method of claim 19, wherein the protective organic layer comprises a long chain organic molecule.

21. The method of claim 20, wherein the long chain organic molecule is selected from a group consisting of thiols, phosphines, amines, alcohols, carbonyls, and carboxylic acids.

22. The method of claim 20, wherein chemisorbing comprises exposing the conductive material to a vapor containing the long chain organic molecule.

23. The method of claim 20, wherein chemisorbing comprises exposing the conductive material to dilute solution containing the long chain organic molecule.

24. The method of claim 19, wherein sealing comprises: depositing a thin film sealant on the porous dielectric.

25. The method of claim 19, wherein desorbing comprises: heating the porous dielectric, the protective organic layer, and the conductive material.

26. The method of claim 19, wherein desorbing comprises: oxidizing the protective organic layer.

* * * * *